(12) United States Patent
Shima et al.

(10) Patent No.: US 12,206,017 B2
(45) Date of Patent: Jan. 21, 2025

(54) ELECTROSTATIC PROTECTION ELEMENT

(71) Applicant: KABUSHIKI KAISHA TOKAI-RIKA-DENKI-SEISAKUSHO, Aichi-ken (JP)

(72) Inventors: Kengo Shima, Aichi-ken (JP); Kazuya Adachi, Aichi-ken (JP)

(73) Assignee: KABUSHIKI KAISHA TOKAI-RIKA-DENKI-SEISAKUSHO., Aichi-ken (JP)

( * ) Notice: Subject to any disclaimer, the term of this patent is extended or adjusted under 35 U.S.C. 154(b) by 258 days.

(21) Appl. No.: 17/677,094

(22) Filed: Feb. 22, 2022

(65) Prior Publication Data

US 2022/0278230 A1   Sep. 1, 2022

(30) Foreign Application Priority Data

Feb. 26, 2021   (JP) ................. 2021-031187

(51) Int. Cl.
    *H01L 29/74*    (2006.01)
    *H02H 9/04*    (2006.01)
    *H01L 23/528*    (2006.01)

(52) U.S. Cl.
CPC ...... *H01L 29/7424* (2013.01); *H01L 29/7436* (2013.01); *H02H 9/046* (2013.01); *H01L 23/528* (2013.01)

(58) Field of Classification Search
CPC .................. H01L 29/7436; H01L 29/74–7424
See application file for complete search history.

(56) References Cited

U.S. PATENT DOCUMENTS

| | | | |
|---|---|---|---|
| 2005/0236674 A1* | 10/2005 | Morishita | ........... H01L 27/0262 257/361 |
| 2018/0261592 A1* | 9/2018 | Soejima | ................ H01L 23/645 |
| 2019/0304936 A1* | 10/2019 | Shaul | ...................... H01L 24/20 |

FOREIGN PATENT DOCUMENTS

| | | |
|---|---|---|
| JP | H09134957 | 5/1997 |
| JP | 2005333120 | 12/2005 |
| JP | 2013149926 A | 8/2013 |
| JP | 2015524169 A | 8/2015 |

(Continued)

OTHER PUBLICATIONS

Japanese Office Action (w/ English translation) for corresponding Application No. 2021-031187, dated May 28, 2024, 7 pages.

*Primary Examiner* — Wasiul Haider
(74) *Attorney, Agent, or Firm* — Dority & Manning, P.A.

(57) ABSTRACT

An electrostatic protection element including: a first impurity layer of second conductivity type formed on a semiconductor substrate of first conductivity type; a second impurity layer of the first conductivity type formed within the first impurity layer; a first contact layer of the first conductivity type formed in a region within the first impurity layer other than at the second impurity layer; a second and a third contact layer both of the second conductivity type and formed within the second impurity layer; and multilayer wiring connected through a stack structure to the first, the second, and the third contact layer, wherein the stack structure includes at least a first layer wiring connected to each of the first, the second, and the third contact layer, and a second layer wiring connected to the first layer wiring directly above each of the first, the second, and the third contact layer.

4 Claims, 4 Drawing Sheets

(56) References Cited

FOREIGN PATENT DOCUMENTS

| JP | 2015198190 | 11/2015 |
| JP | 2018152435 A | 9/2018 |

\* cited by examiner

ELECTROSTATIC PROTECTION ELEMENT

CROSS-REFERENCE TO RELATED APPLICATION

This application claims priority under 35 USC 119 from Japanese Patent Application No. 2021-031187, filed on Feb. 26, 2021, the disclosure of which is incorporated by reference herein.

BACKGROUND

Technical Field

The present disclosure relates to an electrostatic protection element.

Related Art

An electrostatic protection element is one element that may be applied to a semiconductor integrated circuit. An electrostatic protection element is a general term used for an element that protects a semiconductor integrated circuit from a surge voltage or current (hereafter referred to as "surge") due to electrostatic or the like inrushing from an external terminal of the semiconductor integrated circuit (a terminal connected to configuration outside the semiconductor integrated circuit). An electrostatic protection element is generally configured by employing a diode, however, there are cases in which a thyristor is employed. A thyristor has a four layer pnpn structure and is a semiconductor element with three terminals in which conduction between an anode and a cathode is enabled mainly by a gate current flowing from a gate to the cathode. In other words, a thyristor is a semiconductor element capable of controlling a main current flowing between an anode and a cathode by controlling agate.

Known document disclosing thyristor type electrostatic protection elements includes, for example, Japanese Patent Application Laid-Open (JP-A) No. 2005-333120. The electrostatic protection element according to JP-A No. 2005-333120 includes a first conductivity type semiconductor substrate, a second conductivity type well formed in the semiconductor substrate, a first conductivity type diffusion layer formed to the second conductivity type well and connected to a signal terminal, a first conductivity type well A formed in the semiconductor substrate, a second conductivity type diffusion layer formed to the first conductivity type well A and connected to a ground terminal, a first conductivity type well B formed to the semiconductor substrate so as to be separated from the first conductivity type well A, and a first conductivity type diffusion layer formed to the first conductivity type well B and connected to a ground terminal.

However, this electrostatic protection element is placed within the semiconductor integrated circuit, with elements in the semiconductor integrated circuit connected together by wiring. The semiconductor integrated circuit also employs multilayer wiring insulated from each other by insulation films, and generally through holes are employed to connect a given wiring layer to another wiring layer.

Known document disclosing through holes includes JP-A No. H9-134957. A semiconductor integrated circuit device according to JP-A No. H9-134957 includes three or more layers of wiring above a semiconductor substrate. The semiconductor integrated circuit device includes a first through hole for electrically connecting first wiring to second wiring disposed in a layer above the first wiring, and a second through hole disposed directly above the first through hole for electrically connecting the second wiring to third wiring in a layer above the second wiring. At least part of the wiring is configured with a stacked layer structure configured from an adhesion layer deposited by a sputtering method, a buried layer deposited by a CVD method, a low resistance main conduction layer deposited by a sputtering method, and a light reflection prevention layer deposited by a sputtering method or by a CVD method.

However, in an electrostatic protection element, surge input from an external terminal escapes as current to a discharge destination, such as ground (earth) or the like. Thus, in order to effectively protect a semiconductor integrated circuit from surge, there is a demand to efficiently discharge the surge when a surge is input in the electrostatic protection element. There is accordingly a need for a path for discharging surge (a discharge path) to have low resistance in order to perform discharge efficiently. Thus a wiring system for disposing the electrostatic protection element within the semiconductor integrated circuit also preferably has a low resistance. Were the wiring structure disclosed in JP-A No. H9-134957 to be applied to the electrostatic protection element according to JP-A No. 2005-333120, then a surge discharge path would be a contact layer formed in an impurity layer, a through hole, a first layer wiring, a through hole, and a second layer wiring. The resistances of each of these elements are accordingly connected in series, with a possibility that the resistance (discharge resistance) of the discharge path would become large. In cases in which a large surge is input when the discharge resistance is large, for example, excessive heat might be generated in the electrostatic protection element, conceivably leading to deterioration or the like to the characteristics of the semiconductor integrated circuit.

SUMMARY

The present disclosure provides an electrostatic protection element that can reduce resistance of a discharge path more in an electrostatic protection element connected to multilayer wiring.

A first aspect of the present disclosure is an electrostatic protection element including: a first impurity layer, having a second conductivity type formed on a main face of a semiconductor substrate having a first conductivity type; a second impurity layer, having the first conductivity type, formed within the first impurity layer; a first contact layer, having the first conductivity type, formed in a region within the first impurity layer other than at the second impurity layer; a second contact layer and a third contact layer, both having the second conductivity type and formed within the second impurity layer; and multilayer wiring connected through a stack structure to the first contact layer, the second contact layer, and the third contact layer, wherein the stack structure includes: a first layer wiring connected to each of the first contact layer, the second contact layer, and the third contact layer, and a second layer wiring connected to the first layer wiring directly above each of the first contact layer, the second contact layer, and the third contact layer.

In the electrostatic protection element according to the first aspect, the first contact layer functioning as an anode, the second contact layer functioning as a gate, and the third contact layer functioning as a cathode are connected by a stack structure including the first layer wiring connected to each of the first contact layer, the second contact layer, and the third contact layer, and the second layer wiring connected to the first layer wiring directly above each of the first contact layer, the second contact layer, and the third contact layer. This accordingly may enable the resistance of a discharge path to be reduced more in an electrostatic protection element connected by multilayer wiring.

In a second aspect of the present disclosure, in the above-described first aspect, the first contact layer and the second contact layer connected together by the multilayer wiring may be connected to a first node in a semiconductor integrated circuit that the electrostatic protection element is built into, and the third contact layer may be connected by the multilayer wiring to a second node having a lower potential than the first node.

According to the electrostatic protection element according to the second aspect a thyristor type electrostatic protection element is connected within a semiconductor integrated circuit. This may enable inrush surge to the semiconductor integrated circuit to be efficiently allowed to escape.

A third aspect of the present disclosure, in the above-described first aspect or the second aspect, may further include a trigger structure configured by the second impurity layer and a third impurity layer of the second conductivity type, the third impurity layer being formed at a periphery of the second contact layer and has a lower impurity concentration than the second contact layer.

The electrostatic protection element according to the third aspect further includes the trigger structure configured by the second impurity layer and the third impurity layer. This may enable electrostatic protection operation to be performed more certainly in cases in which surge has rushed into the semiconductor integrated circuit.

In a fourth aspect of the present disclosure, in the above aspects, may further include: a fourth contact layer, having the second conductivity type, formed in a region within the first impurity layer other than at the second impurity layer and connected to the first contact layer and the second contact layer by the multilayer wiring; and a fifth contact layer formed within the second impurity layer and connected to the third contact layer by the multilayer wiring, wherein each of the fourth contact layer and the fifth contact layer is connected to the multilayer wiring through the stack structure.

According to the electrostatic protection element according to the fourth aspect, at initial operation of the electrostatic protection element, the fourth contact layer is able to fix the potential of the anode to a specific potential and the fifth contact layer is able to fix the potential of the cathode to a specific potential. This may enable operation of the electrostatic protection element to be stabilized.

According to the above aspects, the electrostatic protection element of the present disclosure may reduce resistance of a discharge path more in an electrostatic protection element connected by multilayer wiring.

BRIEF DESCRIPTION OF THE DRAWINGS

Exemplary embodiment will be described in detail based on the following figures, wherein.

DETAILED DESCRIPTION

Figure 1:
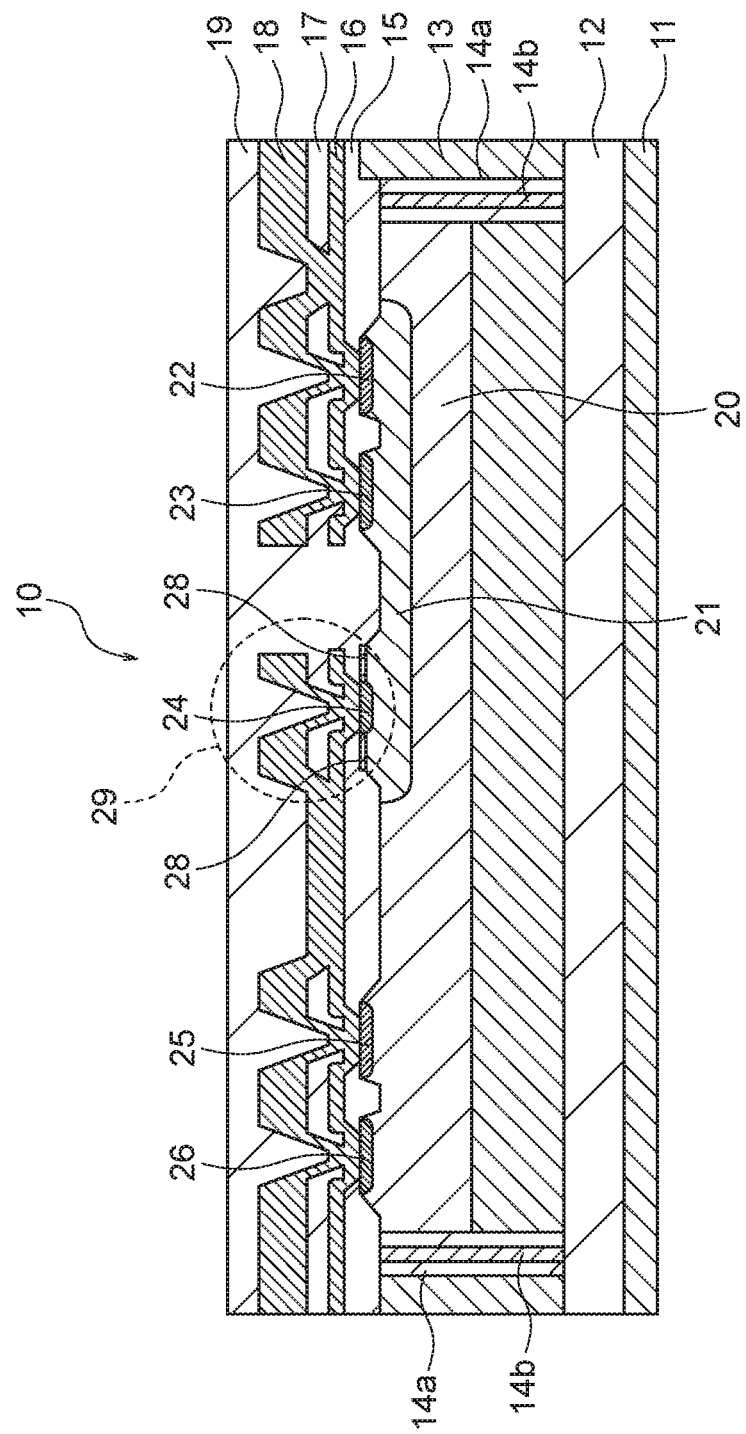
FIG. 1 is a cross-sectional view illustrating a configuration of an electrostatic protection element according to an exemplary embodiment of the present disclosure.

Explanation follows regarding an electrostatic protection element according to an exemplary embodiment of the present disclosure, with reference to the drawings. In the following explanation, an example of an electrostatic protection element according to the present exemplary embodiment will be explained for an embodiment in which a thyristor type electrostatic protection element is applied. Moreover, the electrostatic protection element according to the present exemplary embodiment is built into a semiconductor integrated circuit, is connected to an input/output terminal or the like of the semiconductor integrated circuit, and includes a function to protect an internal circuit from surge or the like. Note that the same reference numerals are appended in the following explanation to configuration elements and portions that are either the same or equivalent to each other, and detailed explanation thereof will be omitted.

Explanation follows regarding an electrostatic protection element 10 according to the present exemplary embodiment, with reference to FIG. 1 to FIG. 4B. FIG. 1 illustrates a cross-section of the electrostatic protection element 10. As illustrated in FIG. 1, the electrostatic protection element 10 includes a semiconductor substrate 11, a buried oxide layer 12, an epitaxial layer 13, a trench 14a, polysilicon 14b, an insulation film 15, a first layer wiring 16, an insulation film 17, a second layer wiring 18, a protection film 19, an N-type layer 20, a P-type layer 21, a P-type layer 22, an N-type layer 23, an N-type layer 24, a P-type layer 25, an N-type layer 26, and an N-type layer 28.

Figure 2A:
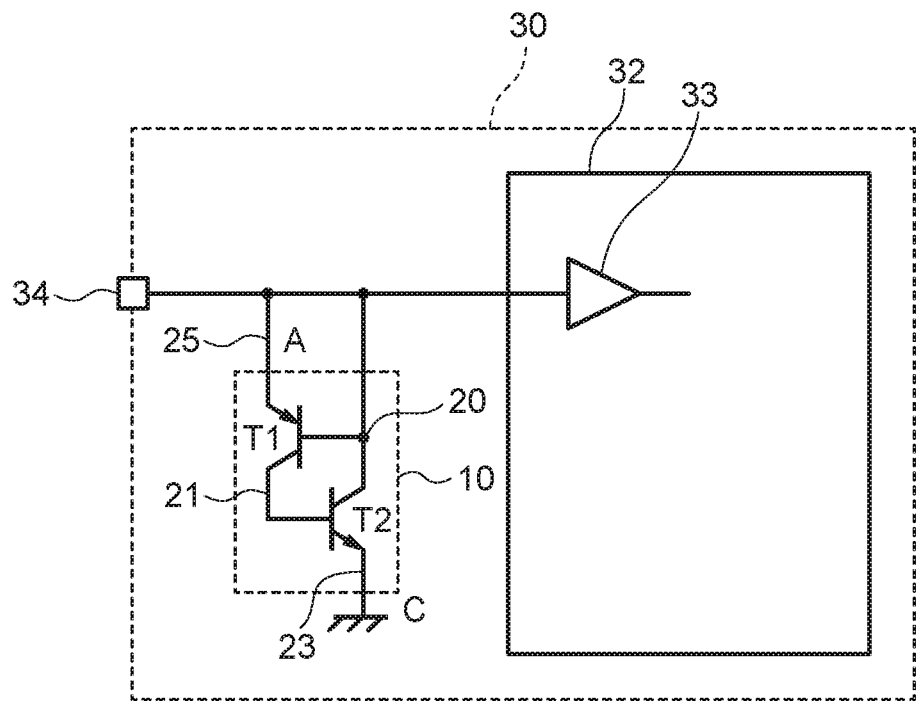
FIG. 2A is a circuit diagram illustrating connections in a semiconductor integrated circuit of an electrostatic protection element according to an exemplary embodiment of the present disclosure, and an equivalent circuit thereof.

FIG. 2A illustrates an example of connections of the electrostatic protection element 10 in a semiconductor integrated circuit 30. The semiconductor integrated circuit 30 includes an internal circuit 32 and an input terminal 34, and the electrostatic protection element 10 is connected between the input terminal 34 and a low potential side of a power source (serving as ground in the present exemplary embodiment). The electrostatic protection element 10 serves as a thyristor, and as illustrated in FIG. 2A, an anode A is connected to the input terminal, and a cathode C is connected to ground, namely the electrostatic protection element 10 is connected in the forward direction. Due to adopting the connection described above, the electrostatic protection element 10 protects the internal circuit 32 from surge inrush from the input terminal 34 by letting the surge escape to ground before reaching, for example, an input buffer 33 of the internal circuit 32. Note that, in the electrostatic protection element 10 the connection position is not limited to being connected to the input terminal 34, and the electrostatic protection element 10 may, for example, be connected to an output terminal, a power source terminal, or the like.

A silicon on insulator (SOI) substrate is employed as an example of a substrate in the electrostatic protection element 10 according to the present exemplary embodiment. The semiconductor substrate 11, the buried oxide layer (BOX) 12, and the epitaxial layer 13 configure parts of the SOI substrate.

The trench 14a is a groove formed from an upper face of the epitaxial layer 13 to a depth reaching the buried oxide layer 12. An oxide film (not illustrated in the drawings) is formed to inside walls, except for at a bottom portion, of the trench 14a, and the polysilicon 14b is filled inside the trench 14a, with the oxide film interposed therebetween. The trench 14a has a function to electrically separate the electrostatic protection element 10 from other circuit elements in the semiconductor integrated circuit 30.

The insulation film 15 is an electrical separation film formed above the epitaxial layer 13. In the electrostatic protection element 10 according to the present exemplary embodiment, electrical separation is achieved by employing, for example, a local oxidation of silicon (LOCOS) structure. As illustrated in FIG. 1, the electrostatic protection element 10 includes a two layers of wiring layers. Namely, the first layer wiring 16 is formed above the insulation film 15, and the second layer wiring 18 is formed on the other side of the insulation film 17 formed above the first layer wiring 16. In the following the "first layer wiring" and the "second layer wiring" will be collectively referred to as "wiring". The protection film 19 formed above the second layer wiring 18 is formed over the entire surface of the semiconductor integrated circuit 30 including over the electrostatic protection element 10, and protects the semiconductor integrated circuit 30 from the external environment, such as humidity and the like.

The N-type layer 20, the P-type layer 21, the N-type layer 23, the N-type layer 24, and the P-type layer 25 configure a thyristor exhibiting the functionality of the electrostatic protection element 10. A P-type layer is a region where a P-type impurity has been introduced into the epitaxial layer 13, and an N-type layer is a region where an N-type impurity has been introduced into the epitaxial layer 13. Note that the N-type layer 20, the P-type layer 21, the P-type layer 25, the N-type layer 24, and the N-type layer 23 are each respective examples of a "first impurity layer", a "second impurity layer", a "first contact layer", a "second contact layer", and a "third contact layer" according to the present disclosure.

As illustrated in FIG. 2A, the thyristor serving as the electrostatic protection element 10 is generally configured by combining two bipolar-type transistors, a transistor T1 and a transistor T2. The transistor T1 is a PNP-type transistor, and the transistor T2 is an NPN-type transistor. FIG. 2A illustrates, all together, equivalent positions of the N-type layer 20, the P-type layer 21, the N-type layer 23, the N-type layer 24, and the P-type layer 25. Namely, the P-type layer 25, the N-type layer 20, and the P-type layer 21 respectively correspond to the emitter, base, and collector portions of the transistor T1, and the N-type layer 20, the P-type layer 21, and the N-type layer 23 respectively correspond to the collector, base, and emitter portions of the transistor T2. In this case the emitter of the transistor T1 (the portion corresponding to the P-type layer 25) is an anode A of the electrostatic protection element 10, and the emitter of the transistor T2 (the portion corresponding to the N-type layer 23) is a cathode C. The anode A and the cathode C of the electrostatic protection element 10 are respectively connected to the input terminal 34 and to ground by, for example, the second layer wiring. Note that the "input terminal 34" and "ground" are examples of a "first node" and a "second node" according to the present disclosure.

Returning to FIG. 1, the N-type layer 26 is connected to a high potential side of a power source, and is an impurity layer for preventing an indeterminate potential state from occurring at initial startup of the electrostatic protection element 10. The P-type layer 22 is an impurity layer for achieving a specific potential (ground in the present exemplary embodiment) as an initial state of an anode of a trigger structure. Note that the "N-type layer 26" and the "P-type layer 22" are respective examples of a "fourth contact layer" and a "fifth contact layer" according to the present disclosure.

Figure 2B:
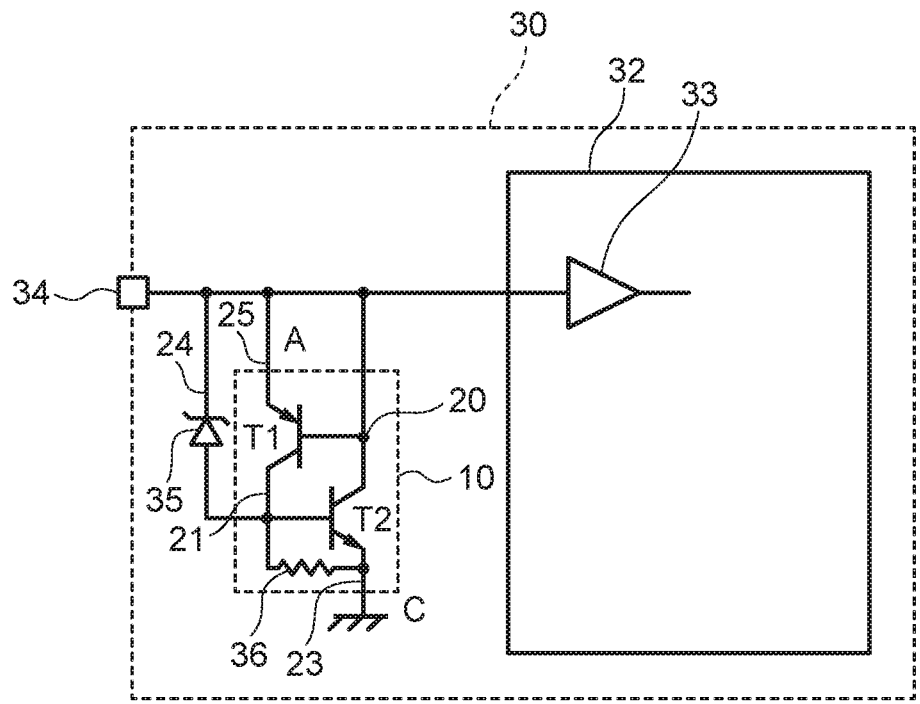
FIG. 2B is a circuit diagram illustrating an equivalent circuit of a trigger structure.

Note that the thyristor electrostatic protection element 10 according to the present exemplary embodiment includes a trigger structure 29. The trigger structure 29 is configured including the N-type layer 24, the N-type layer 28, and the P-type layer 21, with the N-type layer 28 being an N-minus layer with a relatively low concentration formed at a periphery of the N-type layer 24, which is an N-plus layer with a relatively high concentration. The present configuration is adopted to alleviate the electric field at avalanche breakdown (except for electric field avalanche breakdown at an impurity layer end portion). A "trigger structure" is a structure that, at first operation of the electrostatic protection element 10, operates the NPN transistor T2 by allowing some current to flow. Namely, when there is avalanche breakdown of the trigger, some current flows to ground, and the base potential of the transistor T2 rises due to parasitic resistance, such that the transistor T2 enters an ON state. In this manner the thyristor electrostatic protection element 10 also transitions overall to an ON state. The trigger structure may, as illustrated in FIG. 2B, be equivalently represented by a tuner diode 35 and a resistance 36. Namely, the N-type layer 24 corresponds to a position of the cathode of the tuner diode 35. The resistance 36 equivalently represents the parasitic resistance mentioned above. Note that although in the present exemplary embodiment an example explained is the electrostatic protection element 10 (thyristor) including a trigger structure, the trigger structure is configuration to make startup operation of the electrostatic protection element 10 more certain, and is not essential configuration. Note that the "N-type layer 28" is an example of a "third impurity layer" according to the present disclosure.

Here, in the electrostatic protection element 10 as described above, it is important to make a resistance value as low as possible for a path to upper layer wiring from the second layer onwards in the multilayer wiring, from each of the impurity layers (the N-type layer 20, the P-type layer 21, the P-type layer 22, the N-type layer 23, the N-type layer 24, the P-type layer 25, and the N-type layer 26). Thus in the electrostatic protection element 10 according to the present exemplary embodiment a stack structure is adopted in which contact and through hole are integrated together. A "contact" in the present exemplary embodiment is via structure directly connected to an impurity layer, and a "through hole" is via structure between wiring. Due to adopting the present stack structure, there is no wiring portion on the path from the impurity layers to upper layer wiring, enabling the connection resistance thereof to be made smaller.

Figure 3:
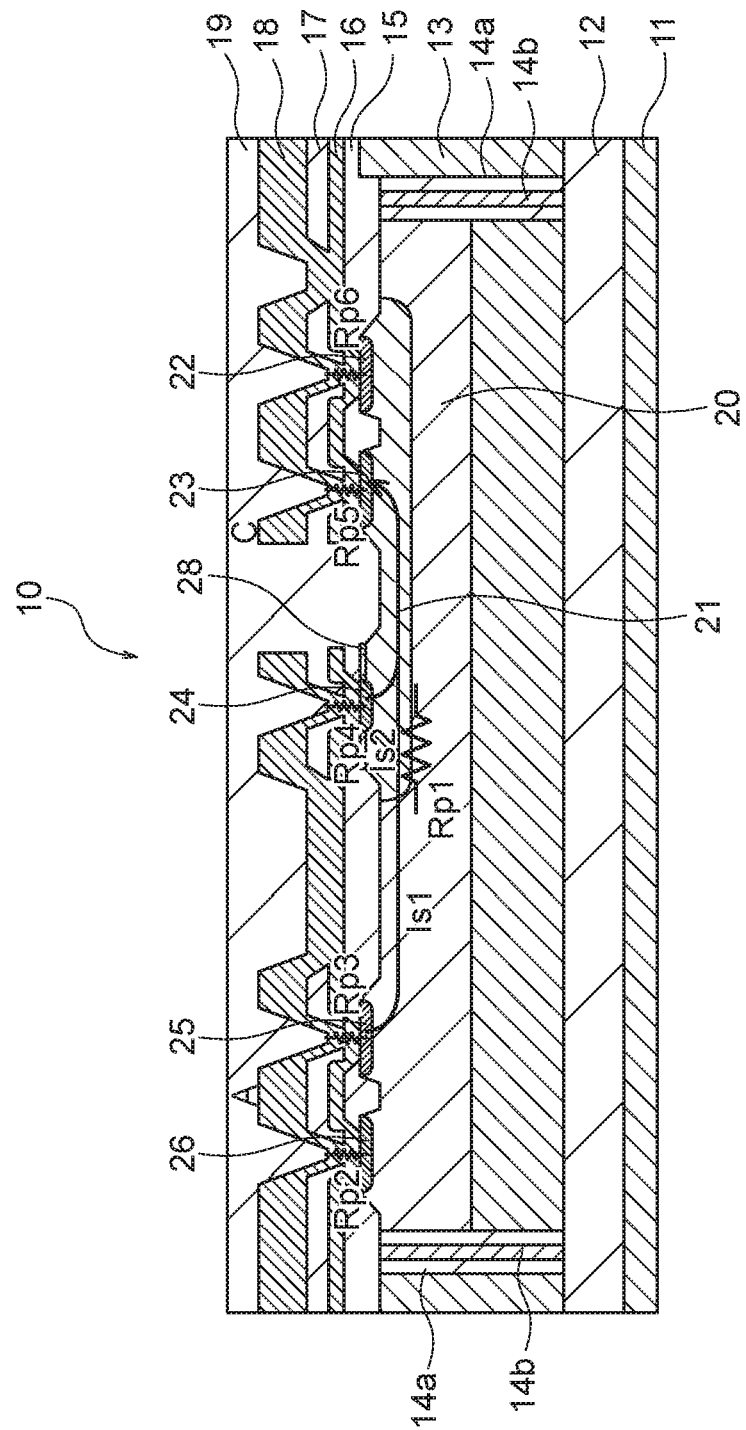
FIG. 3 is cross-sectional view to explain a discharge path of an electrostatic protection element according to an exemplary embodiment of the present disclosure.

A path of current flowing in the electrostatic protection element 10 (current path) and parasitic resistance on the current path will now be explained, with reference to FIG. 3. A main current Is1 flows from the anode A toward the cathode C through the N-type layer 20 and the P-type layer 21, and a trigger current Is2 flows from the N-type layer 24, which is a cathode of a trigger structure, toward the cathode C. On these current paths there are respective resistances Rp2, Rp3, Rp4, Rp5, and Rp6 present as parasitic resistances due to contact and through hole at respective positions of the N-type layer 26, the P-type layer 25, the N-type layer 24, the N-type layer 23, and the P-type layer 22. Moreover, there is also a total resistance Rp1 present for the N-type layer 20 and the P-type layer 21. For example, the resistances Rp3, Rp1, and Rp5 are present on the path of the main current Is1 flowing from the anode A toward the cathode C. In the electrostatic protection element 10, a stack structure is adopted at these positions to reduce as much as possible the parasitic resistance arising due to contact and through hole.

Figure 4A:
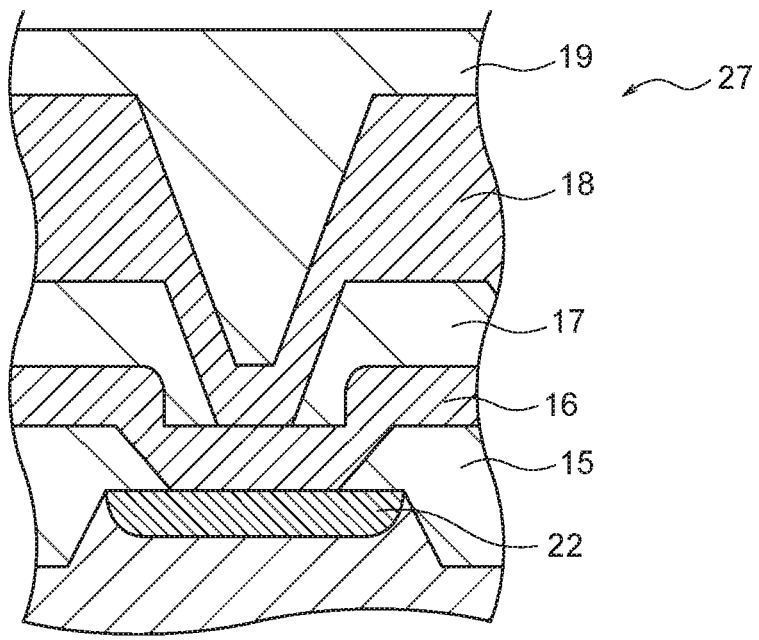
FIG. 4A is a diagram to explain a stack structure according to an exemplary embodiment of the present disclosure.

Detailed explanation follows regarding a stack structure according to the present exemplary embodiment, with reference to FIG. 4A. FIG. 4A illustrates, as an example, a stack structure formed on the P-type layer 22, however, similar configuration may be adopted for other stack structures. As described above, the electrostatic protection element 10 includes the first layer wiring 16 formed on the insulation film 15, and a second layer wiring of the second layer wiring 18 formed above the first layer wiring 16, with the first layer wiring 16 and the insulation film 17 interposed therebetween. As illustrated in FIG. 4A, a stack structure 27 according to the present exemplary embodiment includes the first layer wiring 16 connected to the P-type layer 22, and the second layer wiring 18 directly above the P-type layer 22 and connected through a through hole to the first layer wiring 16. The stack structure 27 enables resistance on the path from the P-type layer 22 to the second layer wiring 18 to be reduced by as much as possible due to the first layer wiring 16 itself not being present on this path. The resistances, namely the discharge resistances, on the paths of the currents Is1, Is2 are thereby able to be made as small as possible.

Figure 4B:
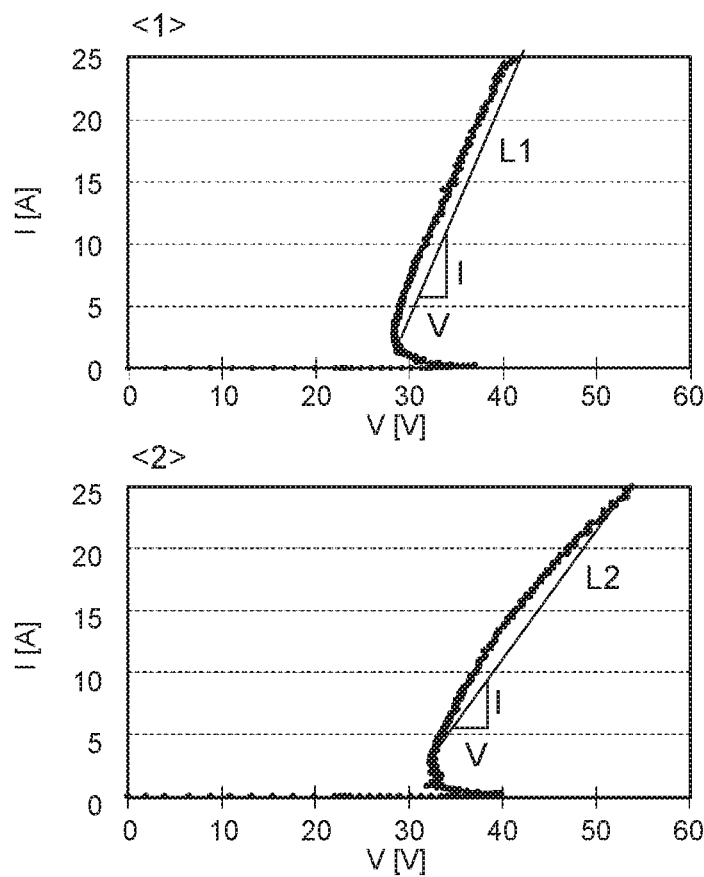
FIG. 4B is a diagram to explain an advantageous effect of the present disclosure.

Explanation follows regarding function of the stack structure 27, with reference to FIG. 4B. FIG. 4B illustrates changes in a current I (A: amperes) with respect to a voltage V (V: volts) between the anode A and the cathode C (hereafter referred to as "V-I characteristics"). At <1> in FIG. 4B, the V-I characteristics according to the present exemplary embodiment are illustrated for a case in which the stack structure 27 according to the present exemplary embodiment is adopted and resistance due to the first layer wiring 16 itself is eliminated. At <2> in FIG. 4B, the V-I characteristics according to a conventional technology are illustrated for a case in which the stack structure 27 according to the present exemplary embodiment is not adopted and the resistance of the first layer wiring 16 itself is present.

The V-I characteristics approximate to straight lines at <1> and <2> of FIG. 4B. When the resistances are computed, a resistance R1 (=V/I) found by approximating the V-I characteristics according to the present exemplary embodiment to a straight line L1 is clearly smaller than a resistance R2 (=V/I) found by approximating the V-I characteristics according to the related technology to a straight line L2. From actual computation, R1 is approximately equal to R2/4, namely the wiring resistance for cases in which the stack structure 27 employed in the present exemplary embodiment Example is about ¼ that of the wiring according to the related technology. Thus, it is apparent that the stack structure 27 according to the present exemplary embodiment effectively contributes to reducing the wiring path resistance.

A manufacturing method of the electrostatic protection element 10 including the stack structure 27 is as summarized below.

Namely, each of the impurity layers (the N-type layer 20, the P-type layer 21, the P-type layer 22, the N-type layer 23, the N-type layer 24, the P-type layer 25, the N-type layer 26, and the N-type layer 28) are first formed on the semiconductor substrate 11.

The insulation film 15 is then formed.

Then through holes are formed in the insulation film 15 at positions corresponding to the P-type layer 22, the N-type layer 23, the N-type layer 24, the P-type layer 25, and the N-type layer 26.

The first layer wiring 16 is then formed over the entire surface of the first layer wiring 16 and patterning performed thereon.

The insulation film 17 is then formed.

Then through holes are formed in the insulation film 17 at positions corresponding to the P-type layer 22, the N-type layer 23, the N-type layer 24, the P-type layer 25, and the N-type layer 26. Namely, through holes are formed in the insulation film 17 directly above the through holes of the insulation film 15.

Then the second layer wiring 18 is formed over the entire surface and patterning performed thereon.

The protection film 19 is then formed.

Note that although in the electrostatic protection element according to the exemplary embodiment described above an example is illustrated of an embodiment in which a thyristor is applied as an element configuring the electrostatic protection element, there is no limitation thereto, and, for example, an embodiment in which a diode is applied may be adopted.

Moreover, although in the exemplary embodiment described above an example is illustrated of an embodiment in which a stack structure is formed by two-layers of wiring, there is no limitation thereto, and an embodiment may be adopted in which a stack structure is formed with multilayer wiring of three or more layers.

What is claimed is:

1. An electrostatic protection element comprising:
   a first impurity layer, having a second conductivity type, formed on a main face of a semiconductor substrate having a first conductivity type;
   a second impurity layer, having the first conductivity type, formed within the first impurity layer;
   a first contact layer, having the first conductivity type, formed in a region within the first impurity layer other than at the second impurity layer;
   a second contact layer and a third contact layer, both having the second conductivity type, formed within the second impurity layer;
   multilayer wiring connected through a stack structure to the first contact layer, the second contact layer, and the third contact layer,
   wherein the stack structure includes:
      a first layer wiring connected to each of the first contact layer, the second contact layer, and the third contact layer, and
      a second layer wiring connected to the first layer wiring directly above each of the first contact layer, the second contact layer, and the third contact layer; and
   a trigger structure configured by the second impurity layer and a third impurity layer of the second conductivity type, the third impurity layer being formed at a periphery of the second contact layer and has a lower impurity concentration than the second contact layer.

2. The electrostatic protection element of claim 1, wherein:
   the first contact layer and the second contact layer connected together by the multilayer wiring are connected to a first node in a semiconductor integrated circuit that the electrostatic protection element is built into, and the third contact layer is connected by the multilayer wiring to a second node having a lower potential than the first node.

3. The electrostatic protection element of claim 1, further comprising:

a fourth contact layer, having the second conductivity type, formed in a region within the first impurity layer other than at the second impurity layer and connected to the first contact layer and the second contact layer by the multilayer wiring; and a fifth contact layer formed within the second impurity layer and connected to the third contact layer by the multilayer wiring, wherein each of the fourth contact layer and the fifth contact layer is connected to the multilayer wiring through the stack structure.

4. The electrostatic protection element of claim 1, wherein the stack structure includes:

an insulation film formed above the first layer wiring; and through holes provided at the insulation film, the through holes penetrate through the insulation film at positions corresponding to the first contact layer, the second contact layer, and the third contact layer, respectively, wherein the second layer wiring is connected to the first layer wiring via the through holes.

\* \* \* \* \*